United States Patent
Ohta et al.

(10) Patent No.: US 8,259,493 B2
(45) Date of Patent: Sep. 4, 2012

(54) NONVOLATILE SEMICONDUCTOR STORAGE DEVICE AND METHOD OF TESTING THE SAME

(75) Inventors: Hitoshi Ohta, Yokohama (JP); Tomohito Kawano, Yokohama (JP); Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 579 days.

(21) Appl. No.: 12/433,173

(22) Filed: Apr. 30, 2009

(65) Prior Publication Data

US 2009/0279357 A1 Nov. 12, 2009

(30) Foreign Application Priority Data

May 7, 2008 (JP) ................. 2008-121633

(51) Int. Cl.
*G11C 11/34* (2006.01)
*G11C 16/04* (2006.01)

(52) U.S. Cl. .............. 365/185.05; 365/185.23; 365/201; 365/230.06

(58) Field of Classification Search ............. 365/185.05, 365/189.09, 201, 230.06, 185.23
See application file for complete search history.

(56) References Cited

U.S. PATENT DOCUMENTS

| 6,233,198 | B1 | 5/2001 | Choi | |
|---|---|---|---|---|
| 6,385,088 | B1* | 5/2002 | Arakawa et al. | 365/185.16 |
| 6,972,996 | B2 | 12/2005 | Hosono et al. | |
| 7,079,417 | B2* | 7/2006 | Nam et al. | 365/185.11 |
| 7,382,670 | B2 | 6/2008 | Kawano et al. | |
| 7,477,549 | B2* | 1/2009 | Honda | 365/185.2 |
| 2004/0233715 | A1* | 11/2004 | Umezawa | 365/185.09 |
| 2005/0237834 | A1* | 10/2005 | Bozano et al. | 365/203 |
| 2005/0254298 | A1* | 11/2005 | Umezawa | 365/185.09 |
| 2008/0123424 | A1 | 5/2008 | Umezawa | |

FOREIGN PATENT DOCUMENTS

JP 2001-43693 2/2001

* cited by examiner

*Primary Examiner* — Toan Le
(74) *Attorney, Agent, or Firm* — Oblon, Spivak, McClelland, Maier & Neustadt, L.L.P.

(57) ABSTRACT

A nonvolatile semiconductor storage device includes a memory cell array including a plurality of memory cells arranged at intersection positions of word lines and bit lines in a matrix form, and a row decoder including a row sub-decoder to which a lower address for selecting a word line is input, wherein one unit of the row sub-decoder for selecting one word line is constituted of a first transistor of a first conduction type, and a second transistor of a second conduction type, and a gate electrode of each of the first and second transistors is arranged in a direction in which the bit lines are arranged.

16 Claims, 14 Drawing Sheets

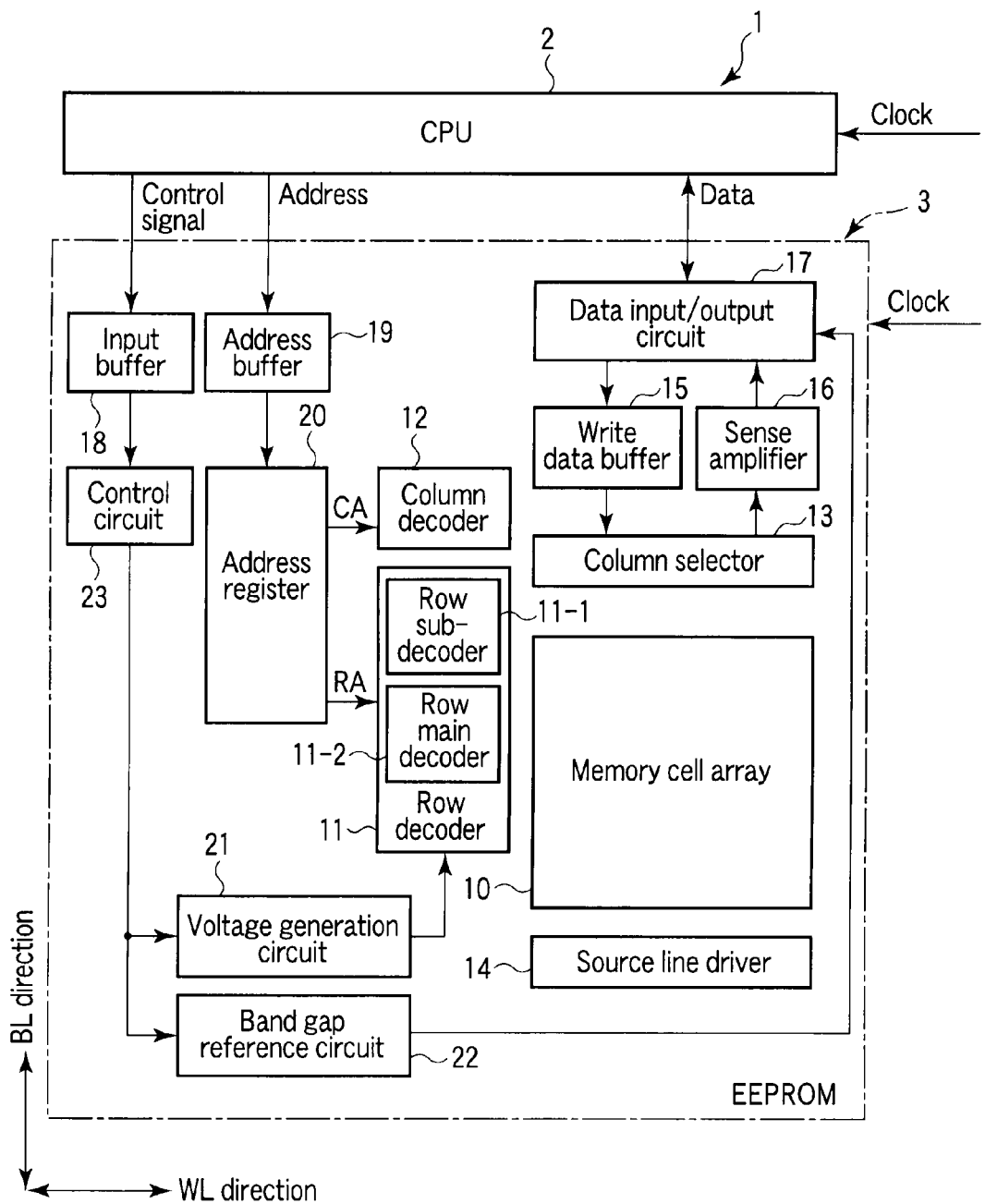
F I G. 1

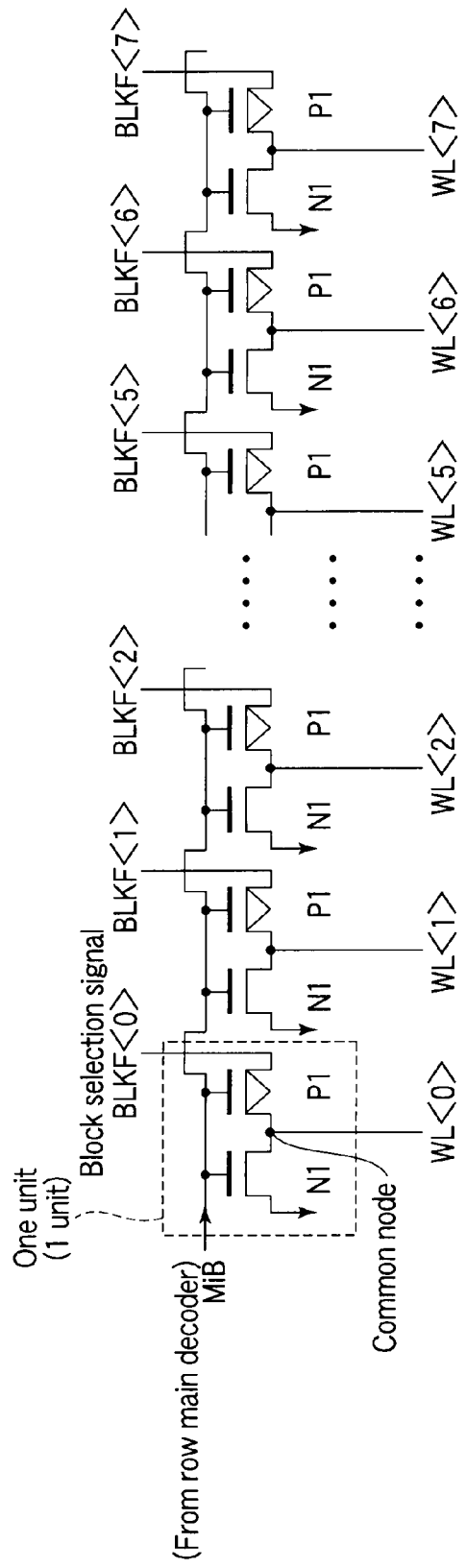
F I G. 6

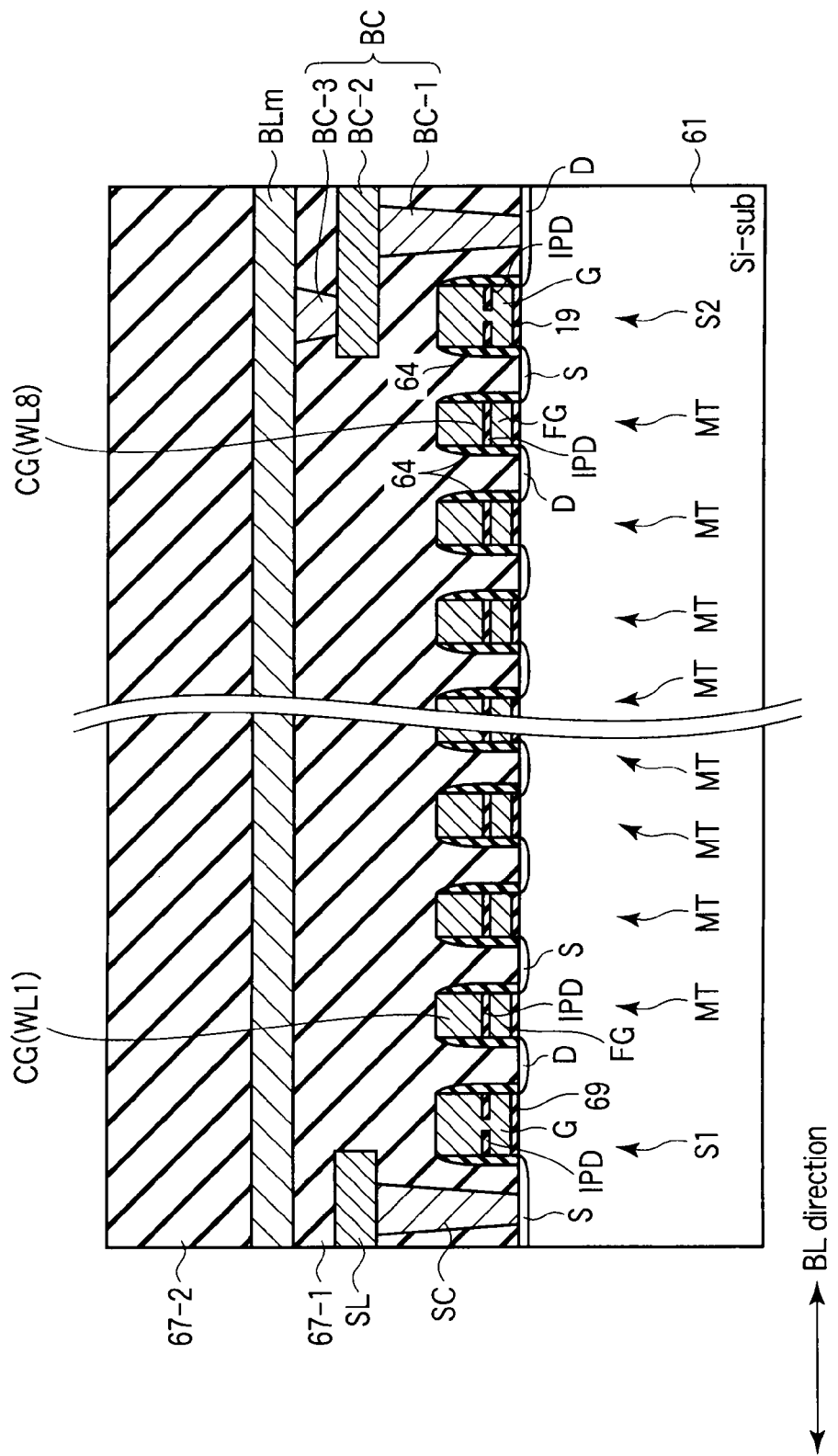
F I G. 11

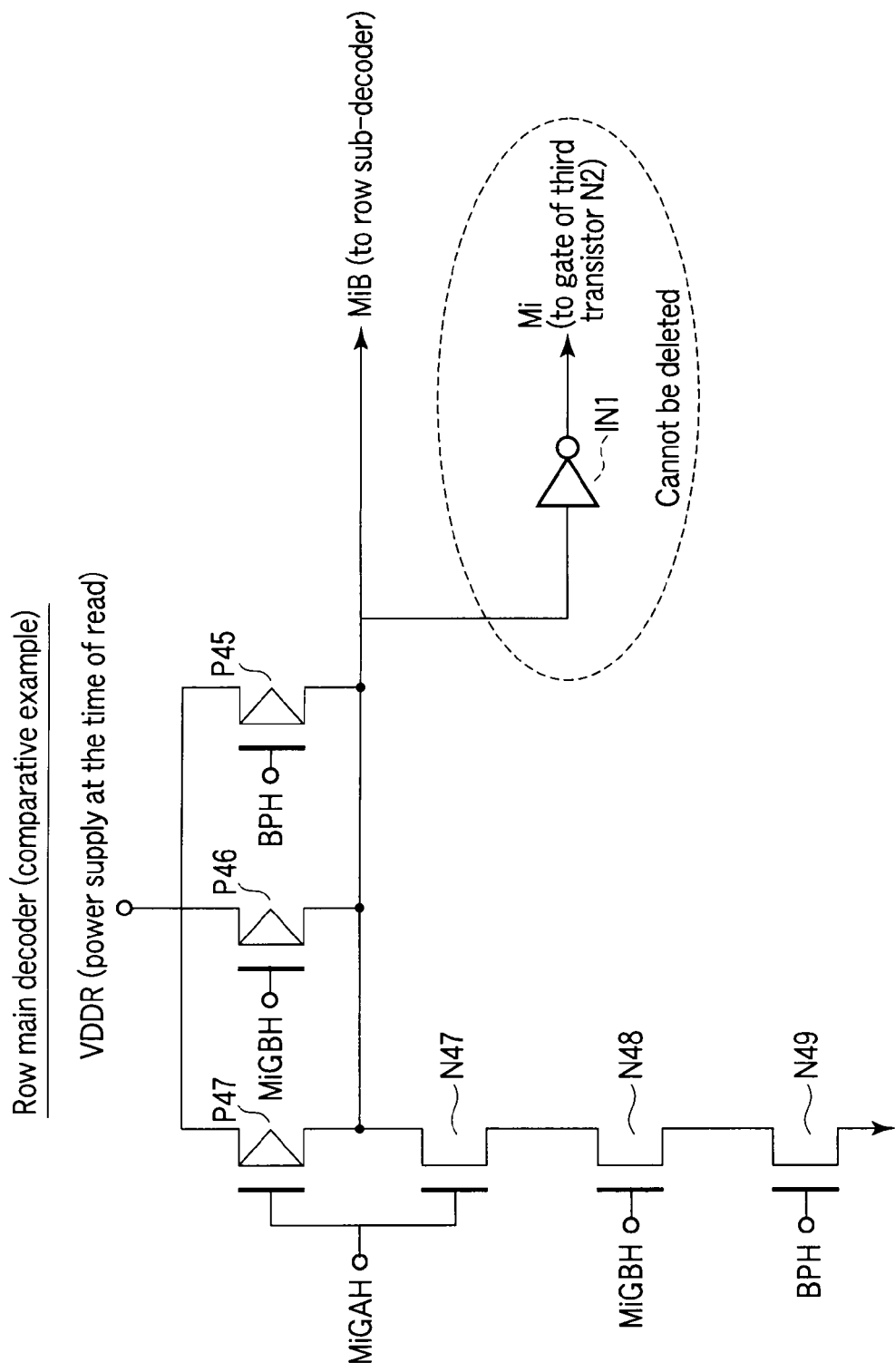
F I G. 15

NONVOLATILE SEMICONDUCTOR STORAGE DEVICE AND METHOD OF TESTING THE SAME

CROSS-REFERENCE TO RELATED APPLICATIONS

This application is based upon and claims the benefit of priority from prior Japanese Patent Application No. 2008-121633, filed May 7, 2008, the entire contents of which are incorporated herein by reference.

BACKGROUND OF THE INVENTION

1. Field of the Invention

The present invention relates to a nonvolatile semiconductor storage device and a method of testing the device.

2. Description of the Related Art

As an example of the nonvolatile semiconductor storage device, there is, for example, a NOR-type flash memory. Many of NOR-type flash memories are provided with a row sub-decoder to which a lower address (row address) is input in order to select a word line (see, for example, Jpn. Pat. Appln. KOKAI Publication No. 2001-43693). As a unit of the row sub-decoder for selecting a word line, there is a unit constituted of, for example, one p-type transistor and two n-type transistors (hereinafter referred to as a 3Tr row sub-decoder). In the conventional generation, a layout configuration of a cell pitch is satisfied in many cases even by a layout arrangement of the 3Tr row sub-decoder.

BRIEF SUMMARY OF THE INVENTION

A nonvolatile semiconductor storage device according to an aspect of the present invention comprising a memory cell array including a plurality of memory cells arranged at intersection positions of word lines and bit lines in a matrix form; and a row decoder including a row sub-decoder to which a lower address for selecting a word line is input, wherein one unit of the row sub-decoder for selecting one word line is constituted of a first transistor of a first conduction type, and a second transistor of a second conduction type, and a gate electrode of each of the first and second transistors is arranged in a direction in which the bit lines are arranged.

A method of testing a nonvolatile semiconductor storage device according to another aspect of the present invention comprising setting a row address corresponding to an odd side word line in a row sub-decoder; applying a stress voltage to the odd side word line; setting a row address corresponding to an even side word line in the row sub-decoder; and applying the stress voltage to the even side word line.

BRIEF DESCRIPTION OF THE SEVERAL VIEWS OF THE DRAWING

FIG. 1 is a block diagram showing an example of the entire configuration of a nonvolatile semiconductor storage device (NOR-type flash memory) according to a first embodiment of the present invention;

FIG. 6 is an equivalent circuit diagram showing one unit of the row sub-decoder according to the first embodiment;

FIG. 11 is a cross-sectional view showing the memory cell array of FIG. 10 in the bit line direction;

FIG. 15 is an equivalent circuit diagram showing one unit of a row main decoder according to the comparative example.

DETAILED DESCRIPTION OF THE INVENTION

Figure 2:
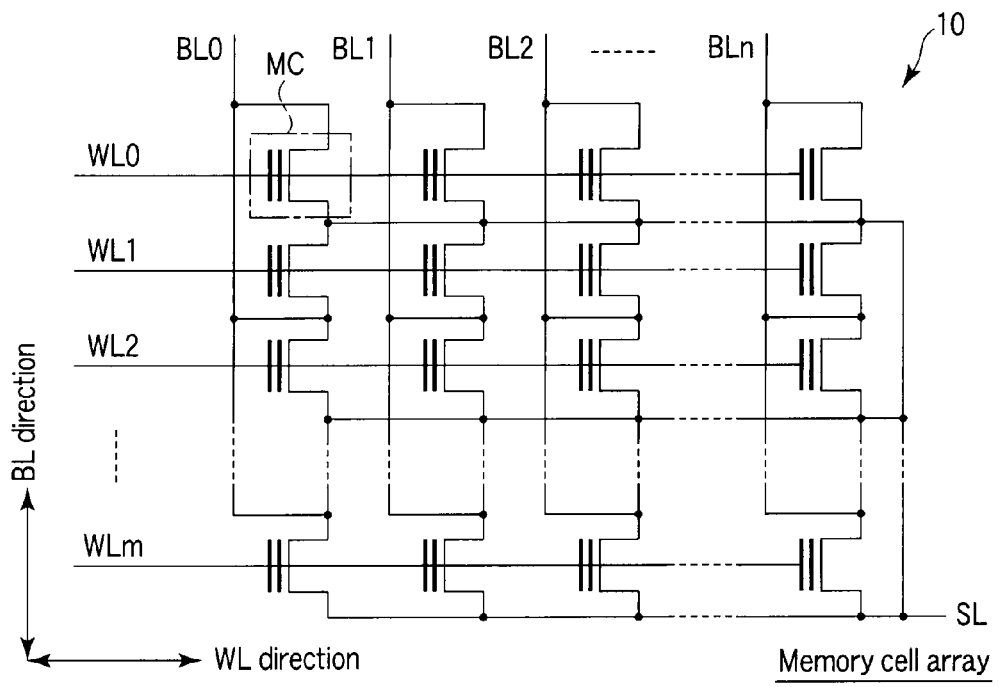
FIG. 2 is an equivalent circuit diagram showing a memory cell array of the nonvolatile semiconductor storage device according to the first embodiment.

Here, when micronization is further advanced in a 3Tr row sub-decoder configuration as will be described later in a comparative example, the cell pitch is reduced. For this reason, it is not possible to carry out the layout of the row sub-decoder so that the micronized cell pitch can be satisfied, and there is a tendency toward disadvantage in micronization.

Thus, embodiments of the present invention will be described below with reference to the accompanying drawings. It should be noted that in this description, parts common to all the drawings will be denoted by the common reference symbols.

First Embodiment

1. Configuration Examples

1-1. Overall Configuration Example (NOR-Type Flash Memory)

First, an overall configuration example of a nonvolatile semiconductor storage device according to a first embodiment of the present invention will be described below by using FIG. 1. In this example, a description will be given by taking a NOR-type flash memory as an example of the nonvolatile semiconductor storage device.

As shown in FIG. 1, a system LSI 1 is provided with a CPU 2, and nonvolatile semiconductor storage device (EEPROM) 3. The CPU 2 and EEPROM 3 are connected to each other through a data bus (not shown) so that they can deliver/receive data to/from each other.

In this example, the EEPROM 3 is, for example, a NOR-type flash memory, and retains a program, data, and the like necessary for the CPU 2 to operate. The CPU 2 performs various types of arithmetic processing by using the data, and the like retained in the EEPROM 3. A clock CLK is input to the CPU 2 and EEPROM 3 from outside. Further, the CPU 2 operates in synchronism with the clock CLK, and the EEPROM 3 outputs data in synchronism with the clock CLK.

Next, details of the configuration of the EEPROM 3 will be described below. As shown in FIG. 1, the EEPROM 3 includes a memory cell array 10, row decoder 11, column decoder 12, column selector 13, source line driver 14, write data buffer 15, sense amplifier 16, data input/output circuit 17, input buffer 18, address buffer 19, address register 20, voltage generation circuit 21, power supply circuit (band gap reference circuit) 22, and control circuit 23.

The memory cell array 10 is constituted of a plurality of blocks. Each of the plurality of blocks is provided with a plurality of NOR-type flash memory cells arranged in a form of a matrix. Each of the memory cells is connected to a bit line, word line, and source line.

The row decoder 11 includes a row sub-decoder 11-1 and row main decoder 11-2, and makes a selection from the memory cell array 10 in the row direction. That is, the row decoder 11 selects a word line.

A lower address (row address) for selecting a word line is input to the row sub-decoder 11-1.

An upper address for selecting a block is input to the row main decoder 11-2.

The column decoder 12 makes a selection from the memory cell array 10 in the column direction. The column selector 13 selects a bit line on the basis of the selection operation of the column decoder 12, and connects the bit line to the write data buffer 15 or sense amplifier 16. The source line driver 14 applies a voltage to the source line. The sense amplifier 16 senses and amplifies data read from a memory cell selected by the row decoder 11 and column decoder 12. The write data buffer 15 retains data to be written to the memory cell, and collectively writes the data to the memory cell in predetermined memory cell units.

The input buffer 18 receives a control signal supplied from the CPU 2, and outputs the signal to the control circuit 23. The control signal is, for example, a chip enable signal, write enable signal, output enable signal, and the like. The chip enable signal is a signal that enables the EEPROM 3 to operate. The write enable signal is a signal that enables data to be written to the EEPROM 3. Further, the output enable signal is a signal that enables data to be output to the EEPROM 3. The address buffer 19 receives an address supplied from the CPU 2, and outputs the address to the address register 20.

The data input/output circuit 17 receives write data supplied from the CPU 2, and transfers the data to the write data buffer 15. Further, the data input/output circuit 17 successively outputs data amplified by the sense amplifier 16 to the CPU 2 in synchronism with the clock.

The address register 20 outputs a column address CA to the column decoder 12 in accordance with an address supplied from the address buffer 19, and outputs a row address RA to the row decoder 11. The column decoder 12 and row decoder 11 respectively perform a selection operation of a bit line or word line on the basis of the column address CA or row address.

The voltage generation circuit 21 generates a voltage in accordance with an external voltage. The voltage generated by the voltage generation circuit 21 is supplied to, for example, the row decoder 11, memory cell array 10, write data buffer 15, sense amplifier 16, and the like.

The power supply circuit 22 is a band gap reference circuit. Hereinafter, the power supply circuit 22 is referred to as the band gap reference circuit 22. The band gap reference circuit 22 generates a voltage $V_{BGR}$, and supplies the voltage to the data input/output circuit 17. The data input/output circuit 17 operates not by using the voltage generated by the voltage generation circuit 21, but by using the voltage $V_{BGR}$ generated by the band gap reference circuit 22 as the power supply voltage.

The control circuit 23 controls the operations of the above-mentioned circuits.

1-2. Configuration Example of Memory Cell Array

Next, a configuration example of the memory cell array 10 will be described below by using FIG. 2. FIG. 2 is a circuit diagram showing a configuration of the memory cell array. As shown in FIG. 2, the memory cell array 10 includes memory cells MC of a number ((m+1)×(n+1)) (m, n: natural number). The memory cell MC is a MOS transistor provided with a stacked gate including a charge storage layer (e.g., a floating gate) and control gate. Further, control gates of memory cells MC in the same row are connected to one of word lines WL0 to WLm which serves as a common connection line. Further, drains of memory cells MC in the same column are connected to one of bit lines BL0 to BLn which serves as a common connection line. Furthermore, sources of the memory cells MC are connected to the same source line SL.

1-3. Cross-Sectional Configuration Example of Memory Cell

Figure 3:
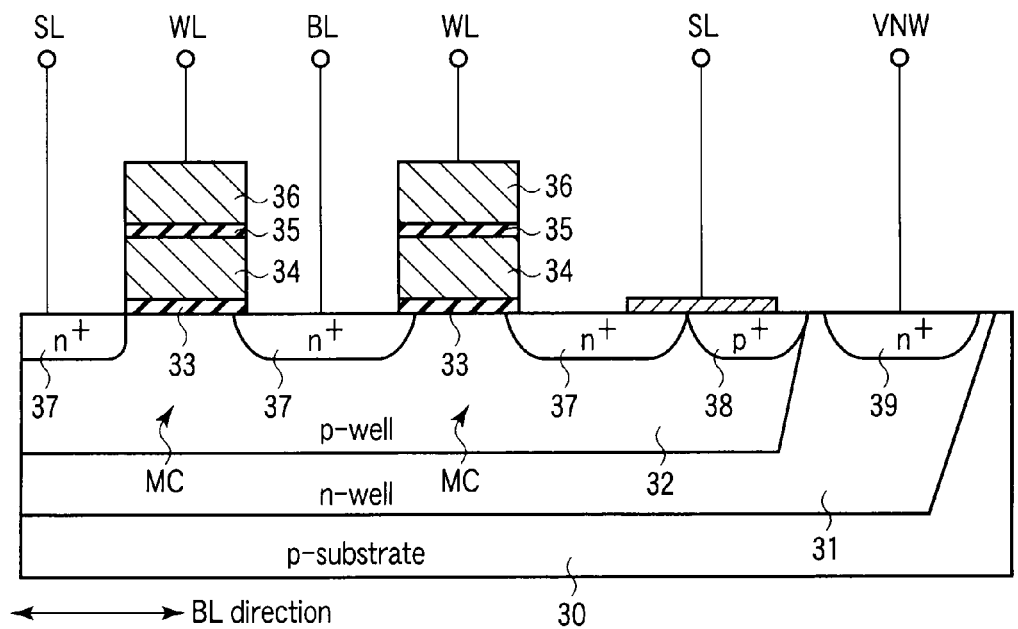
FIG. 3 is a cross-sectional view showing the memory cell array in the bit line direction.

Next, a cross-sectional configuration example of the memory cell MC will be described below by using FIG. 3. FIG. 3 is a cross-sectional view of a partial area of the memory cell array 10. As shown in FIG. 3, an n-type well region 31 is formed in a surface region of a p-type semiconductor substrate 30, and a p-type well region 32 is formed in a surface region of the n-type well region 31.

A gate insulator 33 is formed on the p-type well region 32, and a gate electrode of a memory cell MC is formed on the gate insulator 33. The gate electrode of the memory cell MC includes a polycrystalline silicon layer 34 formed on the gate insulator 33, and a polycrystalline silicon layer 36 formed on the polycrystalline silicon layer 34 through an inter-gate insulator 35 interposed between the layers 34 and 36.

The inter-gate insulator 35 is formed of an ON film, NO film, or ONO film which is a laminated structure of, for example, silicon dioxide films, or a silicon dioxide film and silicon nitride film. The polycrystalline silicon layer 34 functions as a floating gate (FG), and is isolated in each memory cell MC. On the other hand, the polycrystalline silicon layers 36 adjacent to each other in the direction perpendicular to the bit line are connected to each other to be connected to a common connection line, thereby functioning as the control gate (word line WL).

An $n^+$ impurity diffusion layer 37 is formed in the surface of the p-type well region 32 at a part positioned between adjacent gate electrodes. The impurity diffusion layer 37 is shared by the transistors adjacent to each other, and functions as a source region or drain region. Further, the source region of the memory cell MC is connected to the source line SL, and the drain is connected to the bit line BL.

Furthermore, a p+ impurity diffusion layer 38 is formed in the surface region of the p-type well region 32, and an $n^+$ impurity diffusion layer 39 is formed in the surface region of the n-type well region 31. The same potential as the source line SL is applied to the p-type well region 32 through the impurity diffusion layer 38, and a well voltage VNW is applied to the n-type well region 31 through the impurity diffusion layer 39.

1-4. Configuration Example of Row Sub-Decoder

Next, a configuration example of a row sub-decoder according to this example will be described below by using FIGS. 4 to 6. In this example, a description will be given by taking, for example, a 2Tr row sub-decoder in which the number of word lines of one block is 512 as an example (WL: 8×row sub-decoder: 64 BLK)

1-4-1. Layout Configuration Example

First, a planar layout example of the row sub-decoder according to this example will be described below by using FIG. 4. As shown in FIG. 4, the row sub-decoder according to this example is a 2Tr row sub-decoder in which one unit for selecting one word line WL is constituted of a first transistor P1 of the p-type (first conduction type) and a second transistor N1 of the n-type (second conduction type). For example, as shown in FIG. 4, the first transistor P1<0> of the p-type and the second transistor N1<0> of the n-type constitute one unit for selecting one word line WL<0>.

Figure 4:
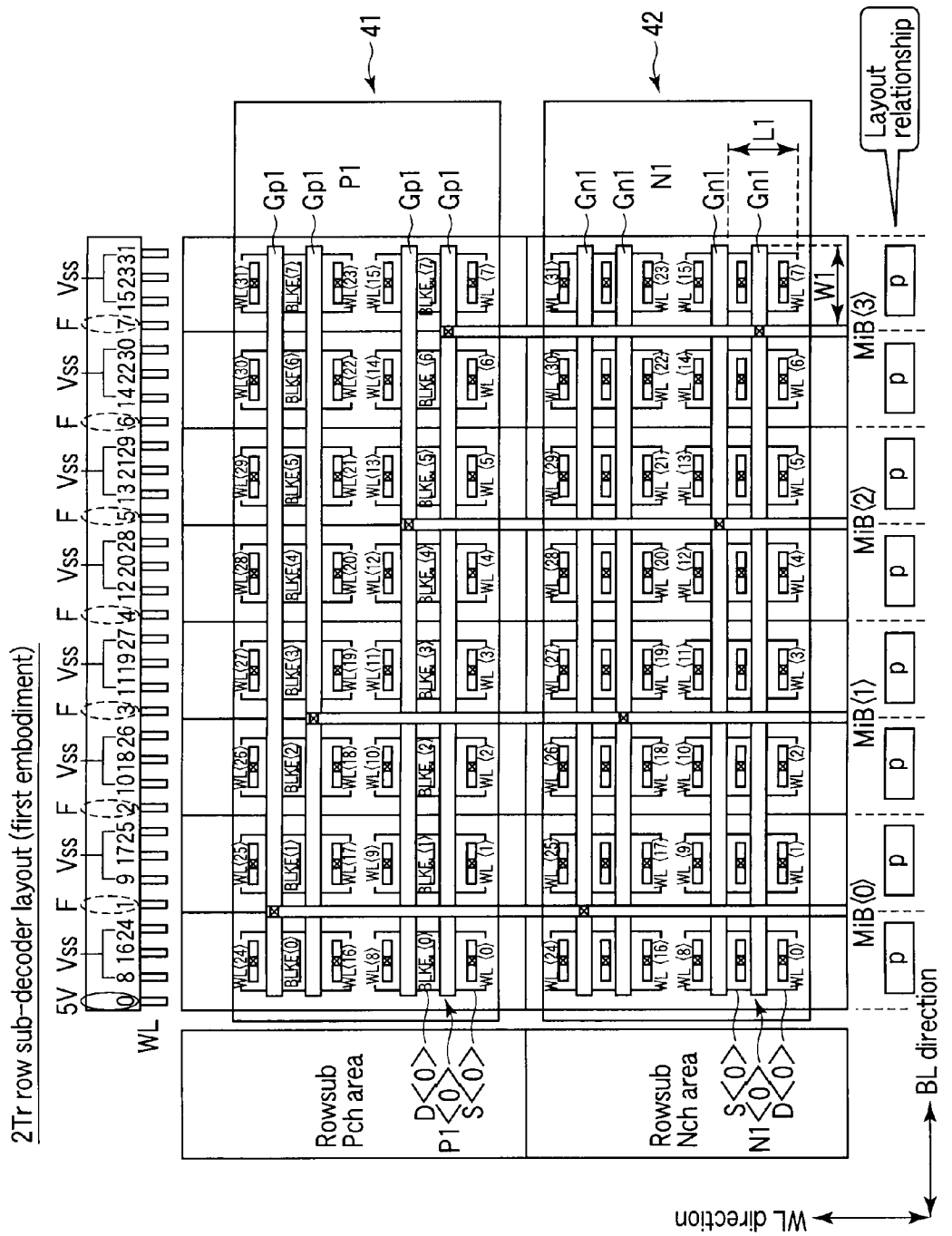
FIG. 4 is a plan view showing a layout example of a row sub-decoder (2Tr-type) according to the first embodiment.

As shown in FIG. 4, gate electrodes Gp1 and Gn1 of the first and second transistors P1 and N1 are laid out in the bit line direction (BL direction). Source/drain diffusion layers S/D of the first and second transistors P1 and N1 are laid out in the word line direction (WL direction) in such a manner that the gate electrodes Gp1 and Gn1 are sandwiched between semiconductor substrates (not shown) of Si or the like to be isolated.

Here, in a comparative example to be described later in connection with FIG. 12, one unit is constituted of three transistors, and the gate electrodes are arranged (vertically arranged on the page surface) in the word line direction, and hence the configuration of the comparative example is disadvantageous to the micronization. This is because in the 65 nm generation and thereafter, when the cell pitch is reduced, the layout pitch of the row sub-decoder needs to be reduced correspondingly, the pitch in the gate length direction L1 is determined by the process factor, whereas the pitch in the gate width direction W1 can be shrunk.

Conversely, in this example, one unit of the row sub-decoder 11-1 for selecting one word line is of the 2Tr type, and one transistor (Nch) can be deleted from the configuration of the comparative example, and hence it is possible to reduce the footprint. Furthermore, the gate electrodes Gp1 and Gn1 of the first and second transistors P1 and N1 are laid out in the bit line direction (BL direction), and hence the pitch in the bit line direction (gate width W1) can be shrunk, which is advantageous to the micronization.

The first transistor P1 is arranged in the semiconductor substrate in a Pch area 41 formed by diffusing p-type impurities such as boron (B) or the like. The second transistor N1 is arranged in the semiconductor substrate in an Nch area 42 formed by diffusing n-type impurities such as phosphorus (P) or the like.

The gate electrode Gp1 of the first transistor P1 is connected to the output MiB of the row main decoder 11-2, the diffusion layer of one end of the current path is connected to the block selection signal BLKF, and the diffusion layer of the other end of the current path is connected to the other end (common node) of the current path of the second transistor N1, and is connected to the word line. For example, the gate electrode Gp1 of the first transistor P1<0> is connected to the output MiB<3> of the row main decoder, the drain diffusion layer D<0> of one end of the current path is connected to the block selection signal BLKF<0>, and the source diffusion layer S<0> of the other end of the current path is connected to the other end of the current path of the second transistor N1 (common node), and is connected to the word line WL<0>.

The gate electrode Gn1 of the second transistor N1 is connected to the output MiB of the row main decoder 11-2, the diffusion layer of one end of the current path is not grounded (not shown), the diffusion layer of the other end of the current path is connected to the other end (common node) of the current path of the first transistor P1, and is connected to the word line. For example, the gate electrode Gn1 of the second transistor N1<0> is connected to the output MiB<3> of the row main decoder, the source diffusion layer S<0> of one end of the current path is grounded (not shown), and the drain diffusion layer D<0> of the other end of the current path is connected to the other end (common node) of the current path of the first transistor P1, and is connected to the word line WL<0>.

As described above, the common node diffusion layer of each of the first and second transistors P1 and N1 is electrically connected to one of the word lines WL<0> to WL<31>.

Furthermore, the layout relationship of the gate electrodes Gp1, Gn1, and the source/drain diffusion layers S/D of the first and second transistors P1, N1 is arranged to be a common repetitive pattern in the bit line direction (the lowermost line in FIG. 4: p-p-p-p-, . . . , -p).

1-4-2. Layout Configuration Example (S/D Wiring, Stress Application Order)

Next, a planar layout example of the row sub-decoder according to this example will be further described below by using FIG. 5. Here, the source/drain contact wiring 43, 44 of each of the first and second transistors P1, N1 is shown, and stress application order in which stress is applied to the word lines WL in the stress test to be described later is shown in the uppermost line.

Figure 5:
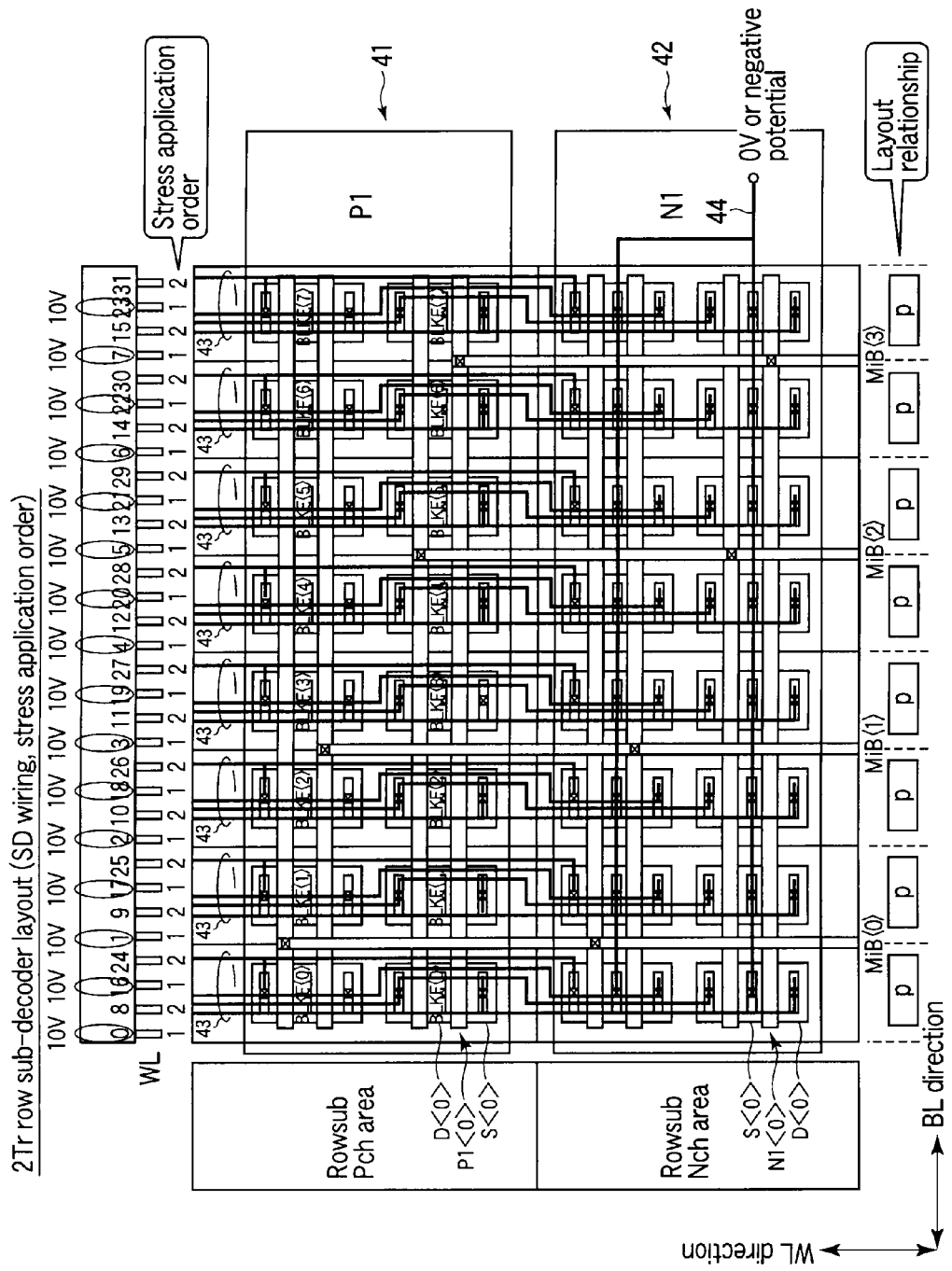
FIG. 5 is a plan view showing the row sub-decoder of FIG. 4 to which source/drain contact wiring and order of stress application to the word lines are added.

As shown in FIG. 5, the source/drain contact wiring 43 of the first and second transistors P1, N1 is arranged in the word line direction. Further, the source contact wiring 44 of the second transistor is drawn out in the bit line direction. The ground potential (0V, or Vss) or negative potential is given to the source contact wiring 44.

As described above, the layout relationship of the source/drain contact wiring 43 of the first and second transistors P1, N1, and the source contact wiring 44 of the second transistor is also arranged to be a common repetitive pattern in the bit line direction (the lowermost line in FIG. 5: p-p-p-p-, . . . , -p).

Here, in the comparative example to be described later in connection with FIG. 12, the arrangement is made so that the layout of one unit can obtain a mirror-image relationship in the bit line direction (the lowermost line in FIG. 12: p-q-p-q-, . . . ,). When such a layout is applied to the 2Tr row sub-decoder according to this example, parts at which the word lines in the floating state (F) are adjacent to each other occur like the word lines WL8, WL16, and hence floating of the word line potential becomes large, and an off-leakage current increases, which is disadvantageous.

On the other hand, the layout relationship of the 2Tr row sub-decoder according to this example is arranged to be a common repetitive pattern in the bit line direction (the lowermost line in FIG. 4: p-p-p-p-, . . . , -p), and hence it is possible to achieve potential shielding by sandwiching a word line in the floating state by means of the ground potential Vss.

As a result of this, it becomes possible to reduce potential floating of a word line in the floating state, and prevent the off-leakage current from increasing.

Figure 12:
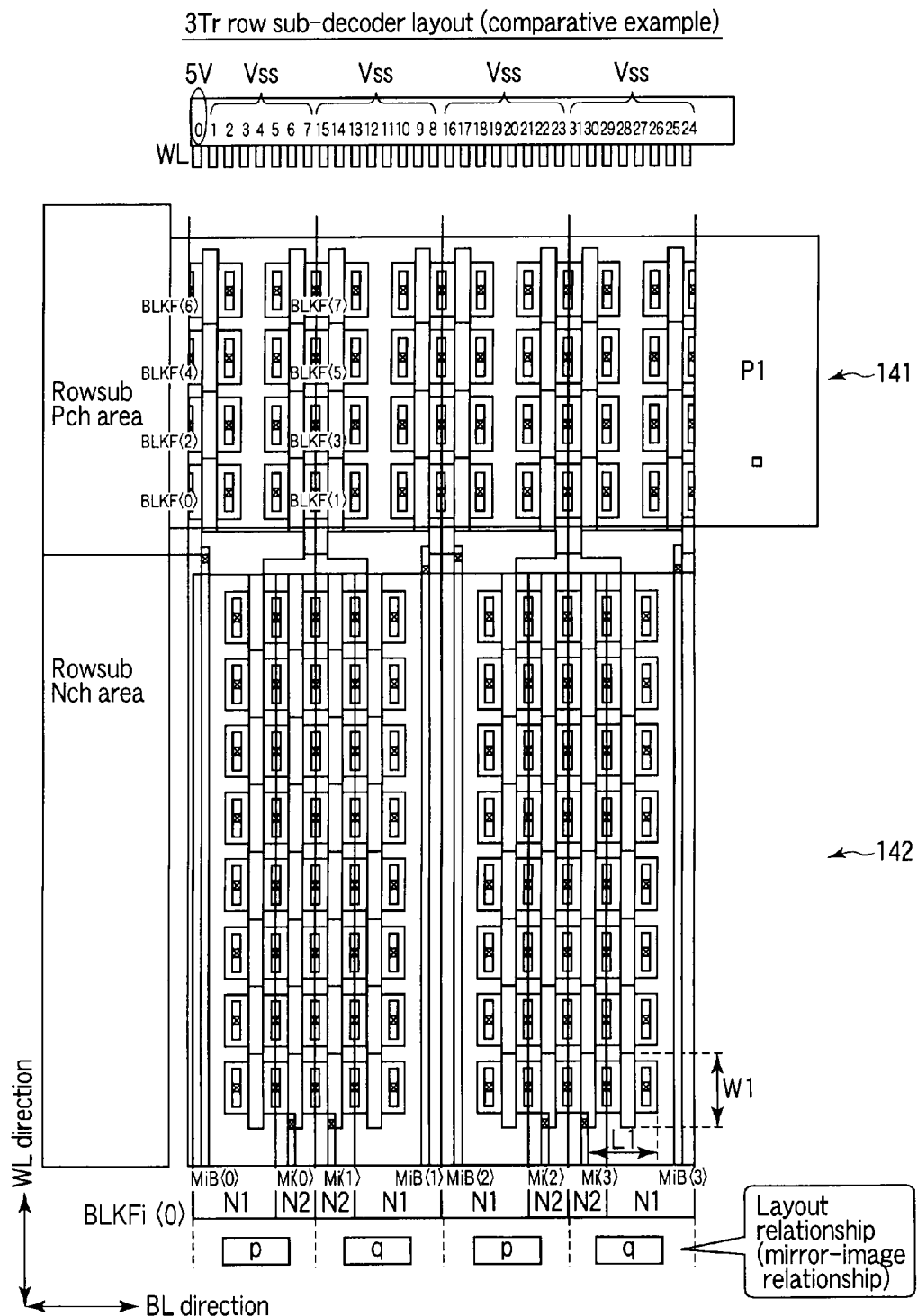
FIG. 12 is a plan view showing a layout configuration of a row sub-decoder (3Tr-type) according to a comparative example.

More specifically, as is evident from the connection relationship shown in FIG. 5, an n-type transistor connected to the output Mi (inverted signal of MiB) from the row main decoder shown in FIG. 12 is not provided in the 2Tr row sub-decoder, and hence there is only the charging path from the p-type transistor (first transistor P1).

Accordingly, in the other row sub-decoder connected to the output MiB common to the selected word line (for example, the row sub-decoder connected to WL<1> to WL<7> when WL<0> is selected), MiB="L", and BLKF="L", and hence the first transistor P1 is turned off. That is, part of the word lines are brought into the floating state concomitantly with the selection of one word line.

Thus, in this example, the layout relationship of the 2Tr row sub-decoder is arranged to be a common repetitive pattern in the bit line direction (the lowermost line in FIG. 4: p-p-p-p-, ..., -p), whereby word lines to be brought into the floating state are prevented from becoming adjacent to each other.

Further, the layout relationship of the 2Tr row sub-decoder is arranged to be a common repetitive pattern in the bit line direction, whereby, for example, when a stress test of applying a high voltage alternately to the odd side word lines and even side word lines is carried out, stress application of two times is sufficient (corresponding to "1" and "2" shown in FIG. 5).

1-4-3. Configuration Example of Equivalent Circuit of Row Sub-Decoder

Next, a configuration example of the equivalent circuit of the row sub-decoder according to this example will be described below by using FIG. 6. As shown in FIG. 6, the row sub-decoder 11-1 according to this example is a 2Tr row sub-decoder in which one unit for selecting a word line WL is constituted of a p-type first transistor P1, and an n-type second transistor N1.

The gate electrode of the first transistor P1 is connected to the output MiB of the row main decoder 11-2, the drain which is one end of the current path is connected to the block selection signal BLKF, and the source which is the other end of the current path is connected to the other end (common node) of the current path of the second transistor N1, and is connected to the word line.

The gate electrode of the second transistor N1 is connected to the output MiB of the row main decoder 11-2, the source which is one end of the current path is grounded through wiring 44 (not shown), and the drain which is the other end of the current path is connected to the other end (common node) of the current path of the first transistor P1, and is connected to the word line.

For example, in FIG. 6, when the word line WL<0> is selected, MiB="H", and BLKF<0>="H", and hence the word line WL<0> is charged through the first transistor P1. On the other hand, as for the unselected word lines WL<1> to WL<7>, BLKF<1> to <7>="L", and hence the first transistors P1 are turned off, and these word lines are brought into the floating state.

1-5. Configuration Example of Equivalent Circuit of Row Main Decoder

Figure 7:
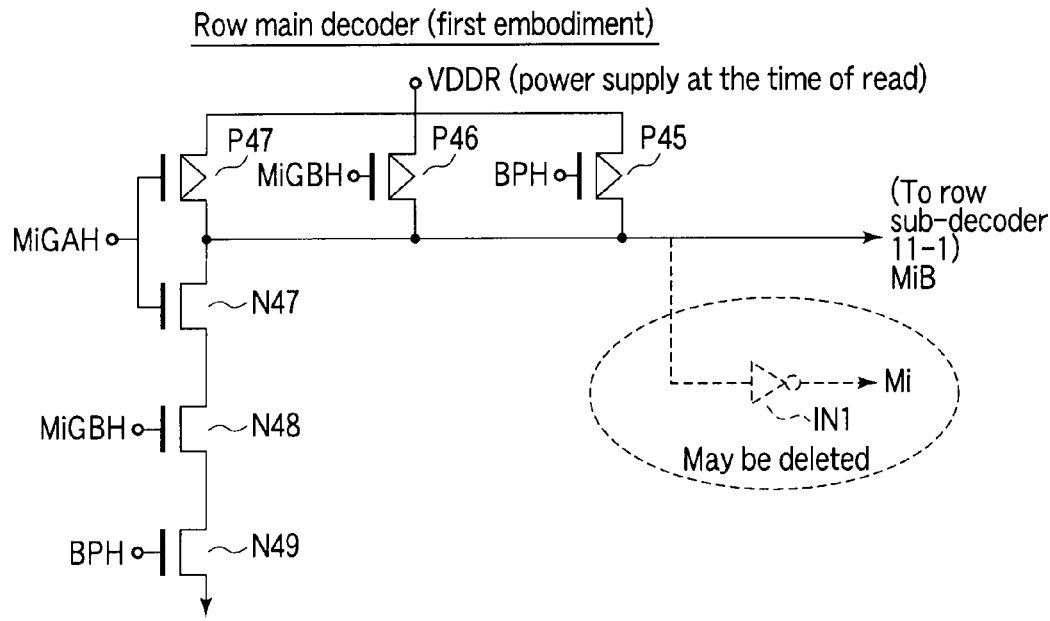
FIG. 7 is an equivalent circuit diagram showing one unit of a row main decoder according to the first embodiment.

Next, a configuration example of the equivalent circuit of the row main decoder 11-2 according to this example will be described below by using FIG. 7. As shown in FIG. 7, one unit of the row main decoder 11-2 is constituted of three p-type transistors P45 to P47, and three n-type transistors N47 to N49.

The gate of the p-type transistor 45 is connected to a signal BPH, one end of the current path is connected to one end of the current path of the p-type transistor P47, and the other end of the current path is connected to the output terminal MiB.

The gate of the p-type transistor P46 is connected to a signal MiGBH (signal decoded by an upper address of the row address), one end of the current path is connected to the power supply voltage VDDR (power supply voltage at the time of read), and the other end of the current path is connected to the output terminal MiB.

The gate of the p-type transistor P47 is connected to a signal MiGAH (signal decoded by a lower address of the row address), and the other end of the current path is connected to the output terminal MiB.

The gate of the n-type transistor N47 is connected to the signal MiGAH (signal decoded by a lower address of the row address), one end of the current path is connected to the output terminal MiB, and the other end of the current path is connected to one end of the current path of the n-type transistor N48.

The gate of the n-type transistor N48 is connected to a signal MiGBH (signal decoded by an upper address of the row address), and the other end of the current path is connected to one end of the current path of the n-type transistor N49.

The gate of the n-type transistor N49 is connected to a signal BPH (block selection signal), and the other end of the current path is grounded.

As described above, in this example, the row sub-decoder 11-1 is configured to be of the 2Tr type. Therefore, the n-type transistor for the Mi terminal is not necessary unlike the 3Tr row sub-decoder according to the comparative example.

Accordingly, as shown in FIG. 7, in the row main decoder 11-2 according to this example, an inverter IN1 needed to supply a signal to the Mi terminal can be deleted. As a result of this, the layout area of the row main decoder 11-2 can be reduced.

2. Stress Application Test

Figure 8:
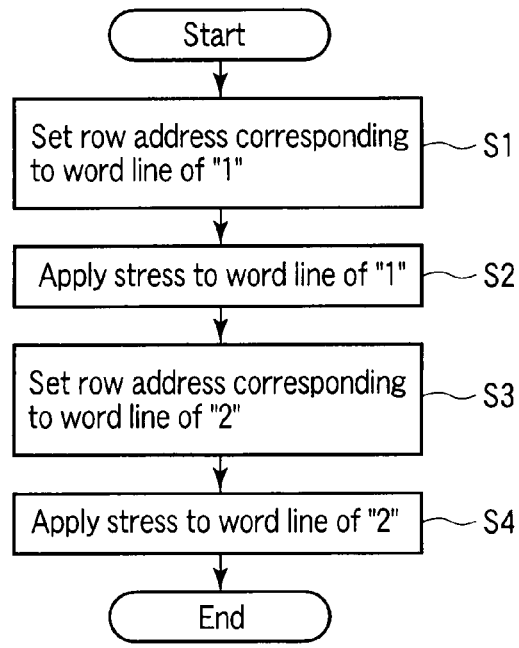
FIG. 8 is a flowchart showing a stress test process of the nonvolatile semiconductor storage device according to the first embodiment.

Next, the method of testing the nonvolatile semiconductor storage device according to this example will be described below by using FIG. 8. Here, as the acceleration test of applying a high voltage to the memory cell, there are, for example, a gate stress test, drain stress test, well stress test, and the like.

Here, the description will be given by taking the gate stress test of applying a stress voltage alternately to odd side word lines and even side word lines at the time of a die sort test of a wafer as an example. This description will be given in accordance with the flow of FIG. 8, with reference to the stress application order of the word lines shown in FIG. 5.

Step S1

First, in step S1, a row address corresponding to a word line (odd side word line) of a number "1" shown in the uppermost line of FIG. 5 is set.

Step S2

Subsequently, in step S2, a voltage (for example, about 10V) serving as a stress for test higher than a selection voltage (for example, about 5V) to be described later is applied to the word line (odd side word line) for which a row address is set to correspond to the number "1". For example, in the uppermost line of FIG. 5, a stress voltage of about 10V is applied to the word line WL<0> corresponding to the number "1".

Step S3

Subsequently, in step S3, a row address corresponding to a word line (even side word line) of a number "2" shown in the uppermost line of FIG. 5 is set.

Step S4

Lastly, in step S4, a voltage (for example, about 10V) serving as a stress for test is applied in the same manner to the word line (even side word line) for which a row address is set to correspond to the number "2". For example, at this time, in the uppermost line of FIG. 5, a stress voltage of about 10V is applied to the word line WL<13> corresponding to the number "2".

Here, in the comparative example to be described later, the layout of one unit is arranged so that a mirror-image relationship can be obtained in the bit line direction (the lowermost line in FIG. 12: p-q-p-q-, . . . ,). For this reason, stress must be applied in total four times in the stress test (S11 to S18 in FIG. 16), which is disadvantageous in the point that the test time and testing cost are increased.

Conversely, in this example, the layout of one unit is arranged to be a common repetitive pattern in the bit line direction (the lowermost line in FIG. 4: p-p-p-p-, . . . , -p). Accordingly, stress application of two times in total is sufficient in the stress test (S1 to S4 in FIG. 6), which is advantageous in the point that the test time and testing cost can be reduced.

3. Normal Operation

Next, the normal operation (write, read, erase, and verify operation) of the nonvolatile semiconductor storage device according to this example will be described below. Here, description will be given by taking a case where one word line WL<0> is selected in the uppermost line in FIG. 4 as an example. In this case, a voltage (for example, a read voltage of about 5V) lower than the stress voltage (for example, about 10V) is applied, as a selection voltage, to the word line WL<0> which is the selected word line.

That is, in the uppermost line in FIG. 4, a voltage of about 5V which is the selection voltage is applied to the selected word line WL<0> in the uppermost line in FIG. 4. Concomitantly with this, the word lines WL<1>, WL<2>, WL<3>, WL<4>, WL<5>, WL<6>, and WL<7> which are controlled by MiB<3> common to the selected word line WL<0> are brought into the floating state (F).

On the other hand, in the word lines WL<8> to WL<15>, WL<16> to WL<23>, and WL<24> to WL<31> which are controlled by MiB<0>, MiB<1>, and MiB<2> that are different from the selected word line WL<0>, MiB="H", and BLKF="L", and hence the ground potential Vss is given to these word lines through the n-type transistor (second transistor N1).

That is, in the 2Tr row sub-decoder, when, like the comparative example to be described later, the layout of the transistors and their wiring constituting the row sub-decoder is arranged so that a mirror-image relationship can be obtained in the bit line direction (the lowermost line in each of FIGS. 12 and 13: p-q-p-q-, . . . ,), seven word lines of the 511 unselected word lines are brought into the floating state (F), these word lines in the floating state become adjacent to each other to cause potential floating, and there is the possibility of an off-leakage current being generated from the memory cell, which is disadvantageous.

However, in this example, the layout of the transistors P1, N1 and their wiring 43, 44 constituting the row sub-decoder 11-1 is arranged to be a common repetitive pattern in the bit line direction (the lowermost line in each of FIGS. 4 and 5: p-p-p-p-, . . . , -p). Accordingly, there occurs no voltage relationship in which word lines to be brought into the floating state (F) are adjacent to each other, and it is possible to sandwich the word line to be brought into the floating state (F) by the ground potential Vss to shield it. As a result of this, it is possible to prevent the potential of the word line to be brought into the floating state from increasing, and hence it is possible to prevent an off-leakage current from being generated from the cell, which is advantageous.

4. Effect According to the First Embodiment

According to the nonvolatile semiconductor storage device and the method of testing the device according to this embodiment, at least the following effects of (1) to (3) can be obtained.

(1) Being Advantageous to Micronization

One unit of the row sub-decoder for selecting one word line according to this example is constituted of a p-type first transistor P1 and an n-type second transistor N1, and the gate electrodes Gp1 and Gn1 of the first and second transistors P1 and N1 are arranged in the direction (BL direction) in which the bit line is arranged. In other words, the gate electrodes Gp1 and Gn1 are laid out laterally on the page surface.

Here, in the comparative example to be described later in connection with FIG. 12, one unit is constituted of three transistors, and the gate electrodes are arranged in the word line direction (longitudinally laid on the page surface), which is disadvantageous to the micronization. This is because in the 65 nm generation and thereafter, when the cell pitch is reduced, the layout pitch of the row sub-decoder needs to be reduced correspondingly, the pitch in the gate length direction L1 is determined by the process factor, whereas the pitch in the gate width direction W1 can be shrunk.

Conversely, in this example, one unit of the row sub-decoder 11-1 for selecting one word line is of the 2Tr type, and one transistor (Nch) can be deleted from the configuration of the comparative example, and hence it is possible to reduce the footprint. Furthermore, the gate electrodes Gp1 and Gn1 of the first and second transistors P1 and N1 are laid out in the bit line direction (BL direction), and hence the pitch in the bit line direction can be shrunk.

Thus, according to the configuration of this example, the configuration is advantageous to the micronization.

(2) Being Able to Reduce Test Time and Resting Cost

Here, in the comparative example to be described later, the row sub-decoder is of the 3Tr type, and the layout of the transistors and their wiring constituting the one unit is arranged so that a mirror-image relationship can be obtained in the bit line direction (the lowermost line in each of FIGS. 12 and 13: p-q-p-q-, . . . ,). For this reason, stress must be applied in total four times in the stress test (S11 to S18 in FIG. 16), which is disadvantageous in the point that the test time and testing cost are increased.

Conversely, in this example, the row sub-decoder 11-1 is of the 2Tr type, and the layout of the transistors P1 and N1, and their wiring constituting the one unit is arranged to be a common repetitive pattern in the bit line direction (the lowermost line in each of FIGS. 4 and 5: p-p-p-p-, . . . , -p). Accordingly, stress application of two times in total is sufficient in the stress test (S1 to S4 in FIG. 6), which is advantageous in the point that the test time and testing cost can be reduced.

(3) Being Able to Prevent Word Line from Becoming in the Floating State, and from Being Floated, Thereby Preventing Off-Leakage Current from Being Generated from Cell Here, in the comparative example to be described later, as described above, the layout of the transistors and their wiring constituting the row sub-decoder is arranged so that a mirror-image relationship can be obtained in the bit line direction (the lowermost line in each of FIGS. 12 and 13: p-q-p-q-, . . . , Accordingly, if it is temporarily attempted to apply the above to the 2Tr row sub-decoder configuration, there is no n-type transistor (Nch) to be connected to the output Mi from the row main decoder, and hence only the charging path from the p-type transistor (Pch) P1 is present. Subsequently, MiB="L", and BLKF="L", and thus the p-type transistor is brought into the off-state, and the word line is brought into the floating state (F).

Figure 13:
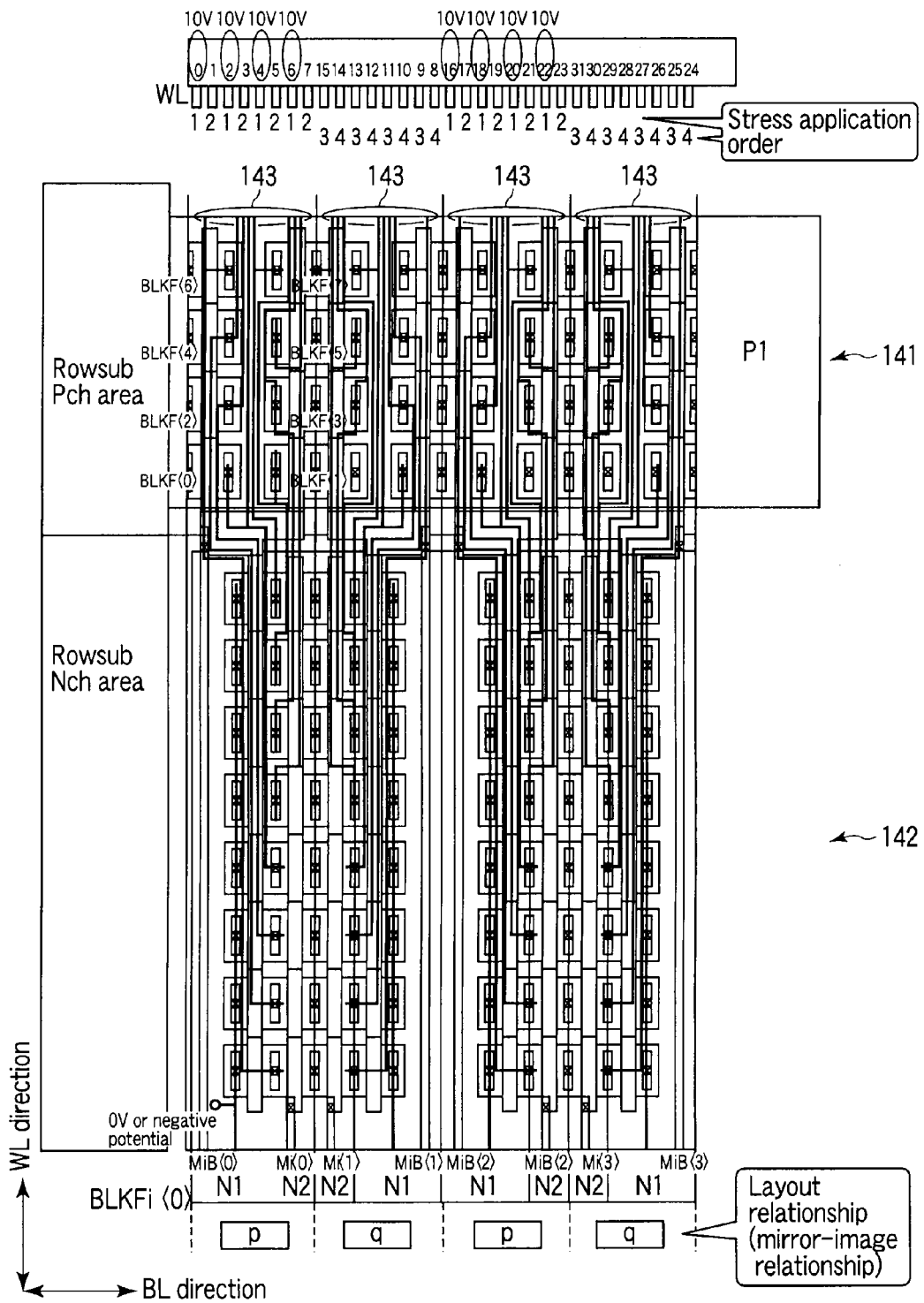
FIG. 13 is a plan view showing the row sub-decoder of FIG. 12 to which source/drain contact wiring and order of stress application to the word lines are added.

As a result of this, as shown in the uppermost line in FIG. 13, word lines to be brought into the floating state (F) become adjacent to each other to be floated, and an off-leakage current is generated from the memory cell, which is disadvantageous. For example, in FIG. 13, a relationship in which, word lines WL<8> and WL<16> to be brought into the floating state become adjacent to each other is brought about. The case where it is simply attempted to apply the configuration of the 3Tr row sub-decoder to the 2Tr row sub-decoder, is disadvantageous in this respect.

Conversely, in this example, the layout of the first and second transistors P1, N1, and their wiring 42, 43 constituting the one unit of the row sub-decoder 11-1 is arranged to be a common repetitive pattern in the bit line direction (the lowermost line in each of FIGS. 4 and 5: p-p-p-p-, . . . , -p).

Accordingly, as shown in the uppermost line of FIG. 4, there occurs no voltage relationship in which word lines to be brought into the floating state (F) become adjacent to each other, and it is possible to sandwich the word line to be brought into the floating state (F) by the ground potential Vss to shield it. As a result of this, it is possible to prevent the potential of the word line to be brought into the floating state from increasing, and hence it is possible to prevent an off-leakage current from being generated from the cell, which is advantageous.

Second Embodiment

Example in Which the Present Invention is Applied to NAND-Type Flash Memory

Next, a nonvolatile semiconductor storage device and a method of testing the device according to a second embodiment of the present invention will be described below by using FIGS. 9 to 11. The second embodiment relates to an example in which the present invention is applied to a NAND-type flash memory. In the description, detailed description of parts overlapping the above embodiment will be omitted.

Overall Configuration Example

First, an overall configuration example of a NAND-type flash memory according to the second embodiment of the present invention will be described below by using FIG. 9. FIG. 9 is a block diagram showing the NAND-type flash memory according to this example.

Figure 9:
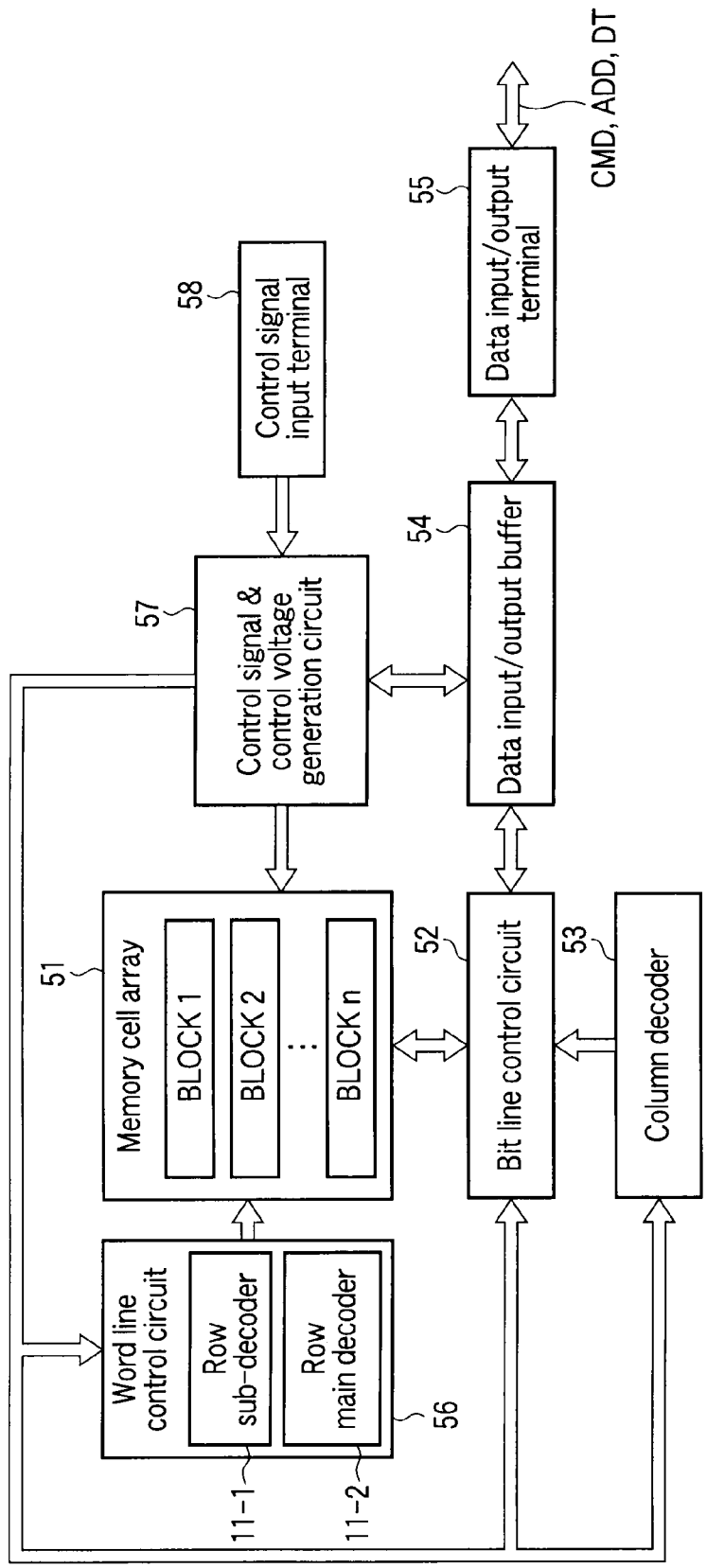
FIG. 9 is a block diagram showing an example of the entire configuration of a nonvolatile semiconductor storage device (NAND-type flash memory) according to a second embodiment of the present invention.
Figure 10:
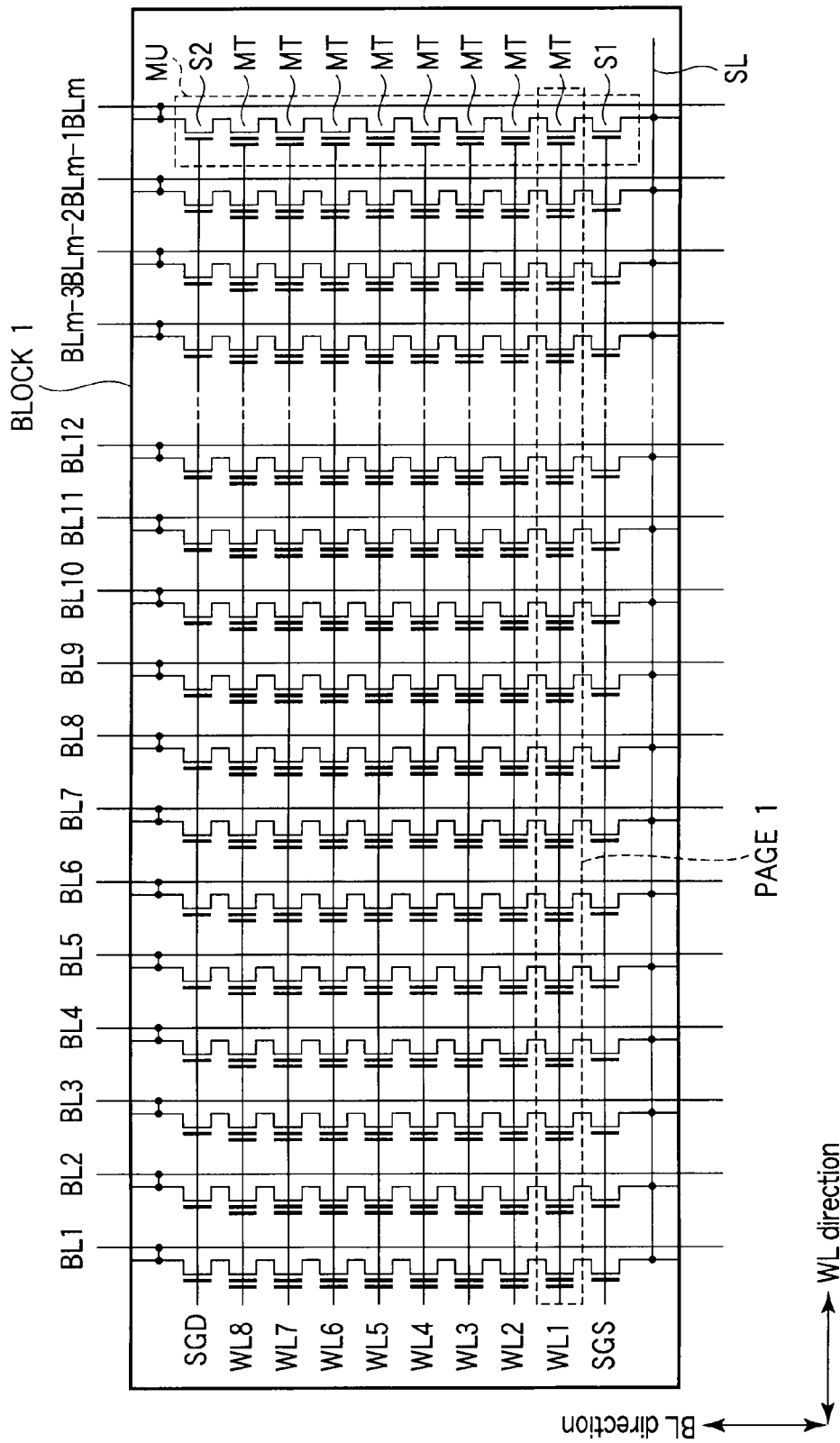
FIG. 10 is an equivalent circuit diagram showing one block of FIG. 9.

As shown in FIG. 9, the NAND-type flash memory is constituted of a memory cell array 51, bit line control circuit 52, column decoder 53, data input/output buffer 54, data input/output terminal 55, word line control circuit 56, control signal & control voltage generation circuit 57, and control signal input terminal 58.

The memory cell array 51 is constituted of a plurality of blocks (BLOCK 1 to BLOCK n). The word line control circuit 56 for controlling the word lines, and the bit line control circuit 52 for controlling the bit lines are connected to this memory cell array 51.

The bit line control circuit 52 reads data of a memory cell transistor in the memory cell array 51 through the bit line, and detects the state of the memory cell transistor in the memory cell array 51 through the bit line. Further, the bit line control circuit 52 applies a write control voltage to the memory cell transistor in the memory cell array 51 through the bit line to write data to the memory cell. The column decoder 53 and data input/output buffer 54 are connected to the bit line control circuit 52.

A data storage circuit (not shown) is provided in the bit line control circuit 52, and the data storage circuit is selected by the column decoder 53. Data of the memory cell transistor read into the data storage circuit is output from the data input/output terminal 55 to the outside through the data input/output buffer 54. The data input/output terminal 55 is connected to, for example, a host apparatus or the like outside the NAND-type flash memory.

The host apparatus is, for example, a microcomputer or the like, and receives data output from the data input/output terminal 55. Furthermore, the host apparatus outputs various commands CMD for controlling the operation of the NAND-type flash memory, an address ADD, and data DT. Write data input from the host apparatus to the data input/output terminal 55 is supplied, through the data input/output buffer 54, to the data storage circuit (not shown) selected by the column decoder 53. On the other hand, the command and address are supplied to the control signal & control voltage generation circuit 57.

The word line control circuit 56 selects a word line in the memory cell array 51, and applies a voltage necessary for read, write, or erase to the selected word line. The word line control circuit 56 is provided with a row sub-decoder 11-1 and row main decoder 11-2 each having the same configuration as described previously.

The control signal & control voltage generation circuit 57 is connected to the memory cell array 51, bit line control circuit 52, column decoder 53, data input/output buffer 54, and word line control circuit 56. The connected circuits configured as described above are controlled by the control signal & control voltage generation circuit 57. The control signal & control voltage generation circuit 57 is connected to the control signal input terminal 58, and is controlled by a control signal such as an address latch enable (ALE) signal or the like input thereto from the host apparatus through the control signal input terminal 58.

Here, the word line control circuit 56, bit line control circuit 52, column decoder 53, and control signal & control voltage generation circuit 57 constitute a write circuit and read circuit.

Configuration Example of Block BLOCK

Next, a configuration example of a block BLOCK constituting the memory cell array 51 will be described below by using FIG. 10. Here, description will be given by taking one block BLOCK 1 as an example. Further, memory cell transistors in the block BLOCK 1 are collectively erased, i.e., the block is an erase unit.

The block BLOCK 1 is constituted of a plurality of memory cell units MU arranged in the word line direction (WL direction). The memory cell unit MU is constituted of a NAND string made up of eight memory cell transistors MT current paths of which are connected in series, a selection transistor S1 connected to one end of the NAND string, and a selection transistor S2 connected to the other end of the NAND string.

It should be noted that although, in this example, the NAND string is constituted of eight memory cells MT, the NAND string has only to be constituted of two or more memory cells, and is not limited to eight memory cells.

The other end of the current path of the selection transistor S2 is connected to a bit line BLm, and the other end of the current path of the selection transistor S1 is connected to a source line SL.

Word lines WL1 to WL8 extend in the WL direction, and are each connected to a plurality of memory cell transistors as a common line. A select gate line SGD extends in the WL direction, and is connected to a plurality of selection transistors S2 in the WL direction as a common line. A select gate line SGS also extends in the WL direction, and is connected to a plurality of selection transistors S1 in the WL direction as a common line.

Further, each of the word lines WL1 to WL8 constitutes a unit called a page (PAGE). For example, as shown by an encircling broken line in FIG. 10, a page 1 (PAGE 1) is assigned to the word line WL1. A read operation or write operation is carried out for each page, and hence the page is a read unit and write unit. It should be noted in the case of a multivalued memory cell in which data of a plurality of bits can be retained, a plurality of pages are assigned to one word line.

Cross-Sectional Structure Example in Bit Line Direction

Next, a cross-sectional structure example in the bit line direction will be described below by using FIG. 11. The description will be given by taking a cross-sectional structure of a memory cell unit MU arranged along the bit line BLm in FIG. 10 as an example.

As shown in FIG. 11, the memory cell unit MU is constituted of the selection transistors S1 and S2 for selecting this memory cell unit MU, and a plurality of memory cells MT.

The memory cell MT is a laminated structure described above provided at an intersection position of a bit line BL and a word line WL. The source S/drain D which is the current path of the memory cell MT is connected in series to the source S/drain D of a memory cell MT adjacent thereto. One end of the current path is connected to the bit line BL through the selection transistor S2, and the other end of the current path is connected to the source line SL through the selection transistor S1.

Further, each of the memory cells MT includes a spacer 64 provided along a side wall of the laminated structure, and a source S/drain D provided in the semiconductor substrate (Si substrate (Si-sub) or P well not shown) 61 to sandwich the laminated structure.

Each of the selection transistors S1 and S2 is provided with a gate insulator 69, an inter-gate insulator IPD, and a gate electrode G. The inter-gate insulator IPD of each of the selection transistors S1 and S2 is provided in such a manner that the insulator IPD is separated at the center thereof to thereby electrically connect the upper and lower layers to each other.

The gate electrode G is formed of, for example, a polysilicon layer and a silicide layer or the like provided on the polysilicon layer.

Each of the selection transistors S1 and S2 likewise includes a spacer 64 provided along a side wall of the gate electrode G, and a source S/drain D provided in the semiconductor substrate 61 to sandwich the gate electrode G.

The bit line BLm is electrically connected to the drain D of the selection transistor S2 through bit line contacts BC-1 to BC-3 in the interlayer insulator 67-1.

The source line SL is electrically connected to the source S of the selection transistor S1 through a source line contact SC in the interlayer insulator 67-1.

Effect According to the Second Embodiment

As described above, according to the nonvolatile semiconductor storage device of this embodiment, at least the same effects as those of the items (1) to (3) described previously can be obtained.

It should be noted that in the description of the first and second embodiments, description has been given by taking a memory cell (FG-type) of a type using a floating gate as the charge storage layer as an example. However, the memory cell is not limited to this. That is, the present invention can also be applied to, for example, a memory cell (MONOS-type) of a type using an insulating layer such as a nitride film as the charge storage layer, and the same effect can be obtained.

Comparative Example

Example of 3Tr Row Sub-Decoder

Next, in order to make a comparison with the nonvolatile semiconductor storage device and the method of testing the device according to each of the first and second embodiments, a nonvolatile semiconductor storage device and a method of testing the device according to a comparative example will be described below by using FIGS. 12 to 16. This comparative example relates to an example (3Tr type) in which, in a row sub-decoder, one unit for selecting one word line is constituted of three transistors. In the description, detailed description of parts overlapping the above embodiments will be omitted.

Layout of 3Tr Row Sub-Decoder

First, the layout of the 3Tr row sub-decoder according to the comparative example will be described below by using FIGS. 12 and 13.

As shown in FIGS. 12 and 13, the row sub-decoder according to the comparative example differs from those of the above embodiments in the point that one unit is constituted of three transistors, and gate electrodes are arranged in the word line direction (vertically arranged on the page surface).

With such a layout configuration, one more n-type transistor (Nch) is need as compared with the above embodiments, and hence the footprint is increased. Furthermore, in the 65 nm generation and thereafter, when the cell pitch is reduced, while the layout pitch of the row sub-decoder needs to be reduced correspondingly, the pitch in the gate length direction L1 is determined by the process factor, and thus cannot be shrunk. For this reason the 3Tr row sub-decoder is disadvantageous to the micronization.

Further, a case is assumed where the number of word lines of one block is 512 (WL: 8×row sub-decoder: 64 BLK). In this case, when one word line is selected at a certain arbitrary address, one selected word line and 511 unselected word lines are present in the 512 word lines.

From the address, Mi="H", and MiB="L" are obtained, one of BLFK<0> to BLFK<7> becomes "H", and the other seven become "L", and hence the one becomes the selected word line, and the other seven become the unselected word lines.

As for the other 504 unselected word lines of the 511 unselected word lines, MiB="H" is obtained, and hence the n-type transistor N1 and those subsequent thereto become "L". Accordingly, all the 511 unselected word lines become "L".

With this configuration, when it is simply attempted to apply the configuration of the 3Tr row sub-decoder to the 2Tr row sub-decoder, there is no n-type transistor N2 (Nch) to be connected to the output Mi of the row main decoder, and hence there is only the charging path from the p-type transistor P1 (Pch).

Accordingly, MiB="L", and BLFK="L", and hence the p-type transistor P1 (Pch) is brought into the off-state, and the word line is brought into the floating state. Seven word lines of the 511 unselected word lines are brought into the floating state, and hence the word lines to be brought into the floating state (F) become adjacent to each other to be floated, and an off-leakage current is generated from the memory cell, which is disadvantageous.

For example, a voltage relationship in which the word lines WL<8> and WL<16> to be brought into the floating state are adjacent to each other in the uppermost line in FIG. 13 is caused. The case where it is simply attempted to apply the configuration of the 3Tr row sub-decoder to the 2Tr row sub-decoder as described above, is disadvantageous in this respect.

Configuration Example of Equivalent Circuit of Row Sub-Decoder

Next, a configuration example of an equivalent circuit of a row sub-decoder according to the comparative example will be described below by using FIG. 14.

Figure 14:
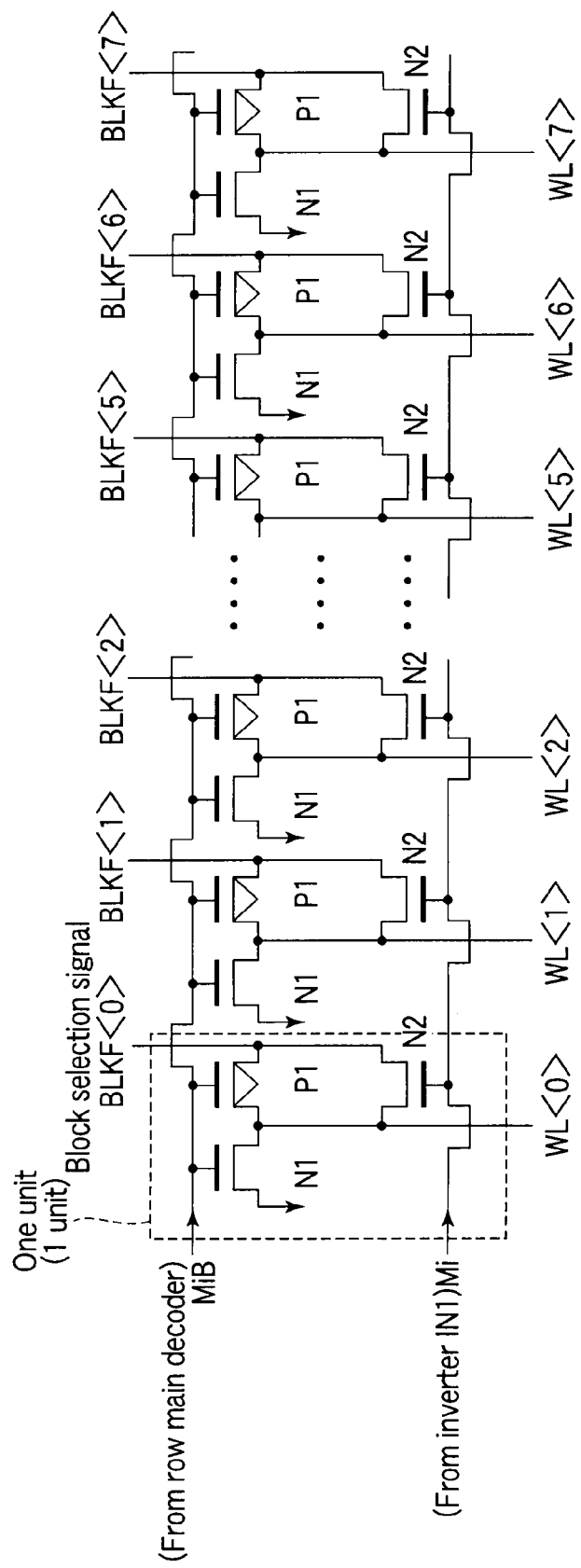
FIG. 14 is an equivalent circuit diagram showing one unit of the row sub-decoder according to the comparative example.

As shown in FIG. 14, the row sub-decoder according to the comparative example differs from those of the above embodiments in the point that one unit for selecting one word line is constituted of three transistors (3Tr type) obtained by further adding one n-type third transistor N2 (Nch) to the 2Tr configuration.

The gate electrode of the third transistor N2 is connected to the output Mi of the inverter IN 1 of the row main decoder, one end of the current path is connected to the word line, and the other end of the current path is connected to the block selection signal BLKF.

Configuration Example of Equivalent Circuit of Row Main Decoder

Next, a configuration example of an equivalent circuit of the row main decoder according to the comparative example will be described below by using FIG. 15. As shown in FIG. 15, the row main decoder differs from those of the above embodiments in the point that one unit thereof is configured by further adding an inverter IN 1.

The input of the inverter IN 1 is connected to the output terminal MiB, and the output (Mi) thereof is connected to the gate electrode of the third transistor N2.

As described above, in this comparative example, the row sub-decoder is configured to be of the 3Tr type. Thus, in the one unit of the row main decoder, the inverter needed to supply an output to the Mi terminal cannot be deleted. As a result of this, the layout area of the row main decoder is increased, which is disadvantageous to the micronization.

Stress Application Test

Figure 16:
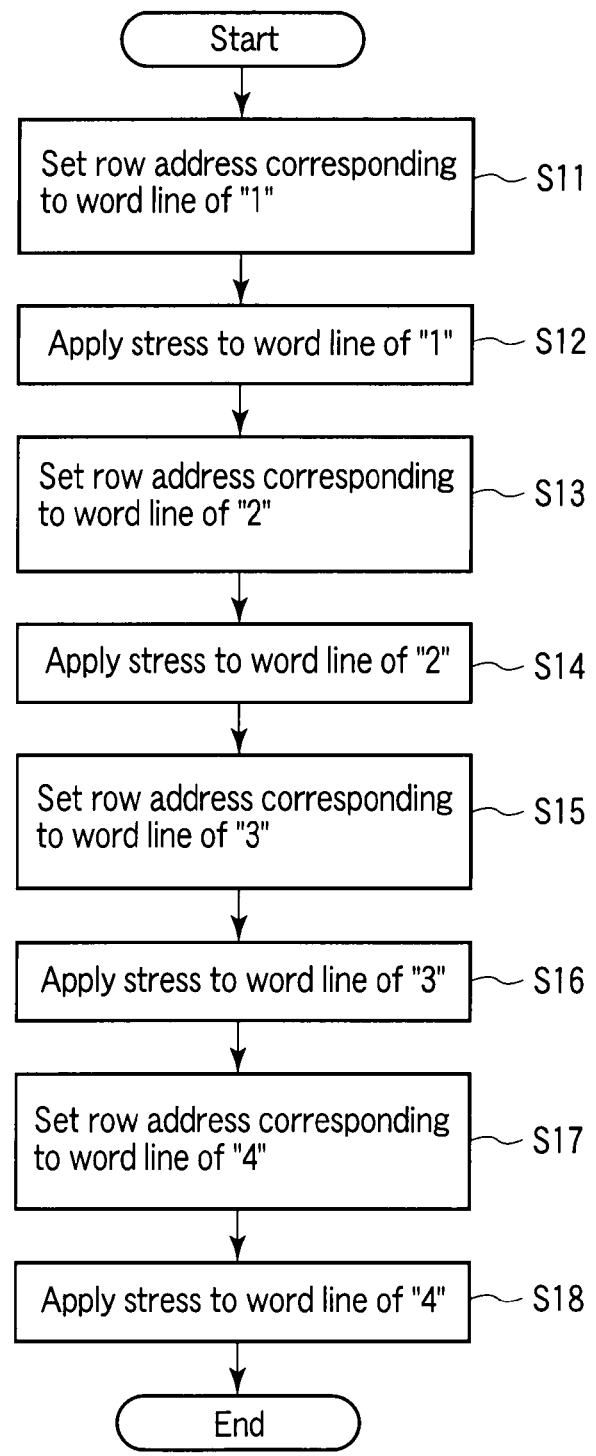
FIG. 16 is a flowchart showing a stress test process of the nonvolatile semiconductor storage device according to the comparative example.

Next, the method of testing the nonvolatile semiconductor storage device according to this example will be described below by using FIG. 16. This description will be given in accordance with the flow of FIG. 16, with reference to the stress application order of the word lines shown in FIG. 13.

Step S11

First, in step S11, a row address corresponding to a word line of a number "1" shown in the uppermost line of FIG. 13 is set.

Step S12

Subsequently, in step S12, a voltage (about 10V) serving as a predetermined stress for test is applied to the word line for which a row address is set to correspond to the number "1".

Step S13

Subsequently, in step S13, a row address corresponding to a word line of a number "2" shown in the uppermost line of FIG. 13 is set.

Step S14

Subsequently, in step S14, a voltage (about 10V) serving as a predetermined stress for test is applied in the same manner to the word line for which a row address is set to correspond to the number "2".

Step S15

Subsequently, in step S15, a row address corresponding to a word line of a number "3" shown in the uppermost line of FIG. 13 is set.

Step S16

Subsequently, in step S16, a voltage (about 10V) serving as a predetermined stress for test is applied to the word line for which a row address is set to correspond to the number "3".

Step S17

Subsequently, in step S17, a row address corresponding to a word line of a number "4" shown in the uppermost line of FIG. 13 is set.

Step S18

Lastly, in step S18, a voltage (about 10V) serving as a predetermined stress for test is applied in the same manner to the word line for which a row address is set to correspond to the number "4".

As described above, in the comparative example, one unit of the row sub-decoder is constituted of three transistors (3Tr type), and the layout of the one unit is arranged to be in a mirror-image relationship in the bit line direction (the lowermost line in FIG. 13: p-q-p-q, . . . ,). For this reason, stress must be applied in total four times in the stress test (S11 to S18 in FIG. 16), which is disadvantageous in the point that the test time and testing cost are increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor storage device comprising:
a memory cell array including a plurality of memory cells arranged at intersection positions of word lines and bit lines in a matrix form; and
a row decoder including a row sub-decoder to which a lower address for selecting a word line is input, wherein
one unit of the row sub-decoder for selecting one word line is constituted of a first transistor of a first conduction type, and a second transistor of a second conduction type, and
a gate electrode of each of the first and second transistors is arranged in a direction in which the bit lines are arranged.

2. The device of claim 1, wherein the gate electrode, a source/drain diffusion layer, and a source/drain contact wiring provided on the source/drain diffusion layer of each of the first and second transistors are arranged to be a repetitive pattern in the bit line direction.

3. The device of claim 2, wherein the source/drain diffusion layer of the first transistor and the source/drain diffusion layer of the second transistor are arranged to be isolated in a direction in which the word lines are arranged.

4. The device of claim 1, wherein the row decoder further includes a row main decoder to which an upper address of the memory cell array is input, and which is used to drive the row sub-decoder.

5. The device of claim 4, wherein the gate electrode of the first transistor is connected to an output of the row main decoder, one end of a current path thereof is connected to the upper address, and the other end of the current path thereof is connected to a word line.

6. The device of claim 4, wherein the gate electrode of the second transistor is connected to the output of the row main decoder, one end of a current path thereof is connected to a reference power supply potential, and the other end of the current path thereof is connected to a word line.

7. The device of claim 1, further comprising a voltage generation circuit for supplying a voltage generated in accordance with an external voltage to the memory cell array, and the row decoder.

8. The device of claim 1, further comprising a band gap reference circuit for generating a band gap reference voltage.

9. The device of claim 1, wherein the device is a NOR-type flash memory.

10. The device of claim 1, wherein the device is a NAND-type flash memory.

11. The device of claim 1, wherein each of the first transistor and the second transistor has a source/drain diffusion layer, the source/drain diffusion layer of the first transistor and the source/drain diffusion layer of the second transistor are arranged to be isolated in a direction in which the word lines are arranged.

12. The device of claim 11, further comprising a P-channel area and an N-channel area which is separated from the P-channel area in the direction in which the word lines are arranged, wherein the first transistor is arranged in the P-channel area and the second transistor is arranged in the N-channel area.

13. The device of claim 12, wherein the row decoder comprises:
three terminals comprising a first terminal, a second terminal and a third terminal;
a third transistor of the second conduction type, a current path of the third transistor being connected between the first terminal and the second terminal;
a fourth transistor of the second conduction type, a current path of the fourth transistor being connected between the first terminal and the second terminal;
a fifth transistor of the second conduction type, a current path of the fifth transistor being connected between the first terminal and the second terminal;
a sixth transistor of the first conduction type, one end of a current path of the sixth transistor being connected to the second terminal, and a gate of the sixth transistor being connected to a gate of the fifth transistor;
a seventh transistor of the first conduction type, one end of a current path of the seventh transistor being connected to the other end of the current path of the sixth transistor; and
an eighth transistor of the first conduction type, one end of the current path of the eighth transistor being connected to the other end of the current path of the seventh transistor, and the other end of the current path of the eighth transistor being connected to the third terminal.

14. The device of claim 11, wherein the row decoder comprises:
three terminals comprising a first terminal, a second terminal and a third terminal;
a third transistor of the second conduction type, a current path of the third transistor being connected between the first terminal and the second terminal;
a fourth transistor of the second conduction type, a current path of the fourth transistor being connected between the first terminal and the second terminal;
a fifth transistor of the second conduction type, a current path of the fifth transistor being connected between the first terminal and the second terminal;
a sixth transistor of the first conduction type, one end of a current path of the sixth transistor being connected to the second terminal, and a gate of the sixth transistor being connected to a gate of the fifth transistor;
a seventh transistor of the first conduction type, one end of a current path of the seventh transistor being connected to the other end of the current path of the sixth transistor; and
an eighth transistor of the first conduction type, one end of the current path of the eighth transistor being connected to the other end of the current path of the seventh transistor, and the other end of the current path of the eighth transistor being connected to the third terminal.

15. The device of claim 1, wherein the row decoder comprises:
three terminals comprising a first terminal, a second terminal and a third terminal;
a third transistor of the second conduction type, a current path of the third transistor being connected between the first terminal and the second terminal;
a fourth transistor of the second conduction type, a current path of the fourth transistor being connected between the first terminal and the second terminal;
a fifth transistor of the second conduction type, a current path of the fifth transistor being connected between the first terminal and the second terminal;
a sixth transistor of the first conduction type, one end of a current path of the sixth transistor being connected to the second terminal, and a gate of the sixth transistor being connected to a gate of the fifth transistor;
a seventh transistor of the first conduction type, one end of a current path of the seventh transistor being connected to the other end of the current path of the sixth transistor; and an eighth transistor of the first conduction type, one end of the current path of the eighth transistor being connected to the other end of the current path of the seventh transistor, and the other end of the current path of the eighth transistor being connected to the third terminal.

16. The device of claim 1, wherein the gate width direction of the gate electrode of each of the first and second transistors is the same as the direction in which the bit lines are arranged.

* * * * *